United States Patent
Pass

(10) Patent No.: US 9,865,753 B2
(45) Date of Patent: Jan. 9, 2018

(54) METALLIZATION OF SOLAR CELLS USING METAL FOILS

(71) Applicant: SunPower Corporation, San Jose, CA (US)

(72) Inventor: Thomas Pass, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 19 days.

(21) Appl. No.: 15/230,163

(22) Filed: Aug. 5, 2016

(65) Prior Publication Data

US 2016/0343888 A1 Nov. 24, 2016

Related U.S. Application Data

(62) Division of application No. 14/040,047, filed on Sep. 27, 2013, now Pat. No. 9,437,756.

(51) Int. Cl.
*H01L 31/18* (2006.01)
*H01L 31/0224* (2006.01)
*H01L 21/00* (2006.01)
*H01L 31/068* (2012.01)

(52) U.S. Cl.
CPC .. *H01L 31/022441* (2013.01); *H01L 31/0682* (2013.01); *Y02E 10/547* (2013.01)

(58) Field of Classification Search
CPC ......... H01L 31/022441; H01L 31/0682; H01L 31/18
See application file for complete search history.

(56) References Cited

U.S. PATENT DOCUMENTS

| | | | |
|---|---|---|---|
| 2005/0263840 A1* | 12/2005 | Maeng | H01L 31/103 257/431 |
| 2008/0173390 A1* | 7/2008 | Narasimhan | B32B 38/10 156/220 |
| 2010/0051085 A1 | 3/2010 | Weidman et al. | |
| 2010/0055822 A1 | 3/2010 | Weidman et al. | |
| 2011/0000532 A1* | 1/2011 | Niira | H01L 31/0747 136/255 |
| 2011/0041902 A1 | 2/2011 | Krokoszinski et al. | |
| 2011/0053312 A1 | 3/2011 | Teppe et al. | |
| 2011/0100448 A1* | 5/2011 | Lee | H01L 31/02167 136/256 |
| 2012/0103408 A1 | 5/2012 | Moslehi et al. | |

* cited by examiner

*Primary Examiner* — Susan D Leong
(74) *Attorney, Agent, or Firm* — Okamoto & Benedicto LLP

(57) ABSTRACT

A solar cell structure includes P-type and N-type doped regions. A dielectric spacer is formed on a surface of the solar cell structure. A metal layer is formed on the dielectric spacer and on the surface of the solar cell structure that is exposed by the dielectric spacer. A metal foil is placed on the metal layer. A laser beam is used to weld the metal foil to the metal layer. A laser beam is also used to pattern the metal foil. The laser beam ablates portions of the metal foil and the metal layer that are over the dielectric spacer. The laser ablation of the metal foil cuts the metal foil into separate P-type and N-type metal fingers.

20 Claims, 7 Drawing Sheets

METALLIZATION OF SOLAR CELLS USING METAL FOILS

CROSS-REFERENCE TO RELATED APPLICATION

This application is a divisional of U.S. application Ser. No. 14/040,047, filed on Sep. 27, 2013, which is incorporated herein by reference in its entirety.

TECHNICAL FIELD

Embodiments of the subject matter described herein relate generally to solar cells. More particularly, embodiments of the subject matter relate to solar cell fabrication processes and structures.

BACKGROUND

Solar cells are well known devices for converting solar radiation to electrical energy. A solar cell has a front side that faces the sun during normal operation to collect solar radiation and a backside opposite the front side. Solar radiation impinging on the solar cell creates electrical charges that may be harnessed to power an external electrical circuit, such as a load. The external electrical circuit may receive electrical current from the solar cell by way of metal fingers that are connected to doped regions of the solar cell.

BRIEF SUMMARY

In one embodiment, a dielectric spacer is formed on a surface of a solar cell structure. A metal layer is formed on the dielectric spacer and on the surface of the solar cell structure that is exposed by the dielectric spacer. A metal foil is placed on the metal layer. A laser beam is used to weld the metal foil to the metal layer. A laser beam is also used to pattern the metal foil. The laser beam ablates portions of the metal foil and the metal layer that are over the dielectric spacer. The laser ablation of the metal foil cuts the metal foil into separate P-type and N-type metal fingers.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The drawings are not drawn to scale.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

In the present disclosure, numerous specific details are provided, such as examples of structures and methods, to provide a thorough understanding of embodiments. Persons of ordinary skill in the art will recognize, however, that the embodiments can be practiced without one or more of the specific details. In other instances, well-known details are not shown or described to avoid obscuring aspects of the embodiments.

FIGS. 1-7 are cross-sectional views that schematically illustrate a method of fabricating a solar cell in accordance with an embodiment of the present disclosure. The solar cell being fabricated is an all back contact solar cell in that the N-type and P-type doped regions and the metal fingers coupled to the N-type and P-type doped regions are on the backside of the solar cell.

Figure 1:
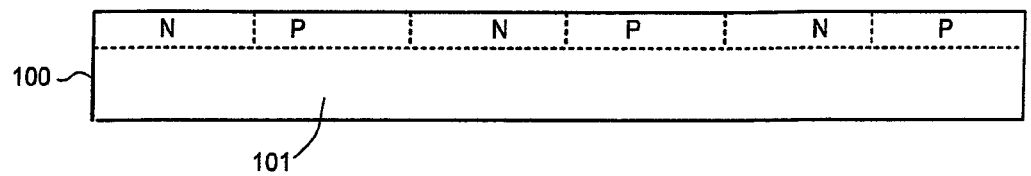
FIGS. 1-7 are cross-sectional views that schematically illustrate a method of fabricating a solar cell in accordance with an embodiment of the present disclosure.

Referring first to FIG. 1, there is shown a solar cell structure 100 in accordance with an embodiment of the present disclosure. In the example of FIG. 1, the solar cell structure 100 comprises a plurality of alternating N-type doped regions and P-type doped regions that may be formed within a solar cell substrate 101 or external to the solar cell substrate 101. For example, the N-type and P-type doped regions may be formed by diffusing N-type and P-type dopants, respectively, into the solar cell substrate 101. In another example, the N-type and P-type doped regions are formed in a separate layer of material, such as polysilicon, that is formed on the solar cell substrate 101. In that example, N-type and P-type dopants are diffused into the polysilicon (which may or may not be trenched) to form N-type and P-type doped regions in the polysilicon, instead of in the solar cell substrate 101. The solar cell substrate 101 may comprise a monocrystalline silicon wafer, for example.

In the example of FIG. 1, the labels "N" and "P" schematically represent the N-type and P-type doped regions or electrical connections to the N-type and P-type doped regions. More particularly, the labels "N" schematically represent exposed N-type doped regions or exposed metal connections to the N-type doped regions. Similarly, the labels "P" schematically represent exposed P-type doped regions or exposed metal connections to the P-type doped regions. The solar cell structure 100 may thus represent the structure of a solar cell being fabricated after contact holes to the N-type and P-type doped regions have been formed, but before the metallization process to form metal contact fingers to the N-type and P-type doped regions.

In the example of FIG. 1, the N-type and P-type doped regions are on the backside of the solar cell structure 100. The backside of the solar cell structure 100 is opposite the front side, which is directed towards the sun to collect solar radiation during normal operation.

Figure 2:
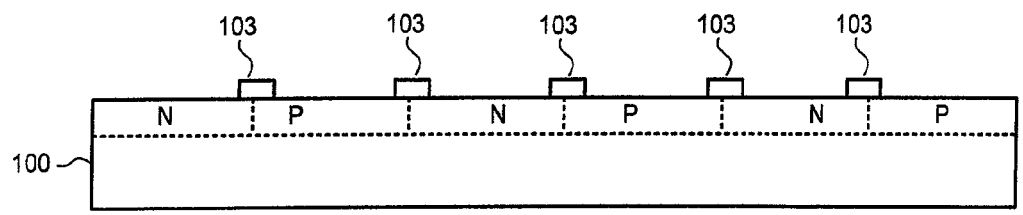

Referring next to FIG. 2, a plurality of dielectric spacers 103 are formed on the surface of the solar cell structure 100. In the example of FIG. 2, a dielectric spacer 103 is formed on a region on the surface of the solar cell structure 100 that is over an interface between adjacent P-type and N-type doped regions. As can be appreciated, the dielectric spacers 103 may be also formed on other regions depending on the particulars of the solar cell structure 100.

In one embodiment, the dielectric spacers 103 are printed on the solar cell structure 100 by screen printing. The dielectric spacers 103 may also be formed using other dielectric formation processes, including by spin coating and by deposition (e.g., chemical vapor deposition) followed by patterning (e.g., masking and etching). The dielectric spacers 103 may comprise a dielectric material with optical absorbers, a fireable dielectric, etc. As a particular example, the dielectric spacers 103 may comprise polyimide (e.g., with titanium oxide filters) that is screen printed on the solar cell structure 100 to a thickness of 1-10 microns. Generally speaking, the dielectric spacers 103 may be configured to have a thickness and composition that will block (e.g., by absorption or reflection) the laser beam employed in the patterning of the metal foil 105 (see FIG. 5), and are compatible with the process employed to form the overlying metal layer (e.g., FIG. 3, metal layer 104).

In the example of FIG. 2, each of the dielectric spacers 103 is formed over an N-type doped region and a P-type doped region of the solar cell structure 100. As will be more apparent below, in a subsequent metallization process, a metal foil is patterned using a laser while the metal foil is on the solar cell structure 100. The dielectric spacers 103 advantageously block laser beams that may penetrate to the solar cell structure 100 during patterning of the metal foil 105.

Figure 3:
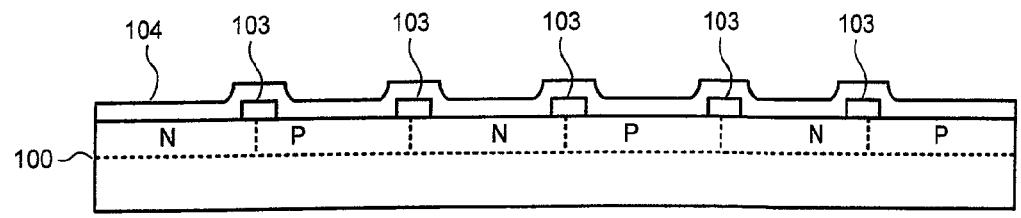

As shown in FIG. 3, a metal layer 104 is formed on the solar cell structure 100. The metal layer 104 provides electrical connection to the N-type and P-type doped regions for the subsequently formed metal fingers. In one embodiment, the metal layer 104 comprises a continuous blanket metal coating that is conformal over the dielectric spacers 103. For example, the metal layer 104 may comprise aluminum that is formed on the dielectric spacers 103, the N-type doped regions, and the P-type doped regions by sputtering, deposition, or some other process to a thickness of 100 Angstroms to 5 microns (e.g., 0.3 micron to 1 micron). Generally speaking, the metal layer 104 comprises a material that can be bonded to the metal foil 105. For example, the metal layer 104 may comprise aluminum to facilitate welding to an aluminum metal foil 105. The metal layer 104 still electrically connects the N-type doped regions to the P-type doped regions in FIG. 3. The metal layer 104 is subsequently patterned to separate the N-type doped regions from the P-type doped regions during patterning of the metal foil 105.

Figure 4:
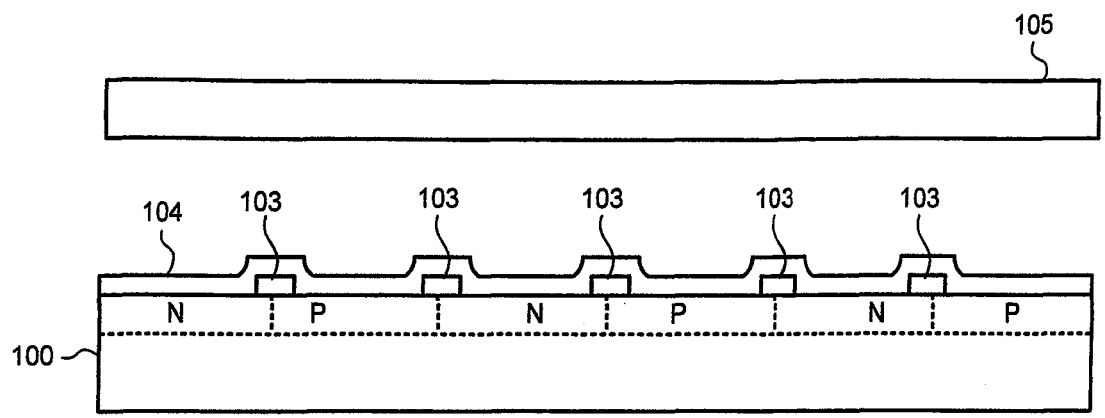
Figure 8:
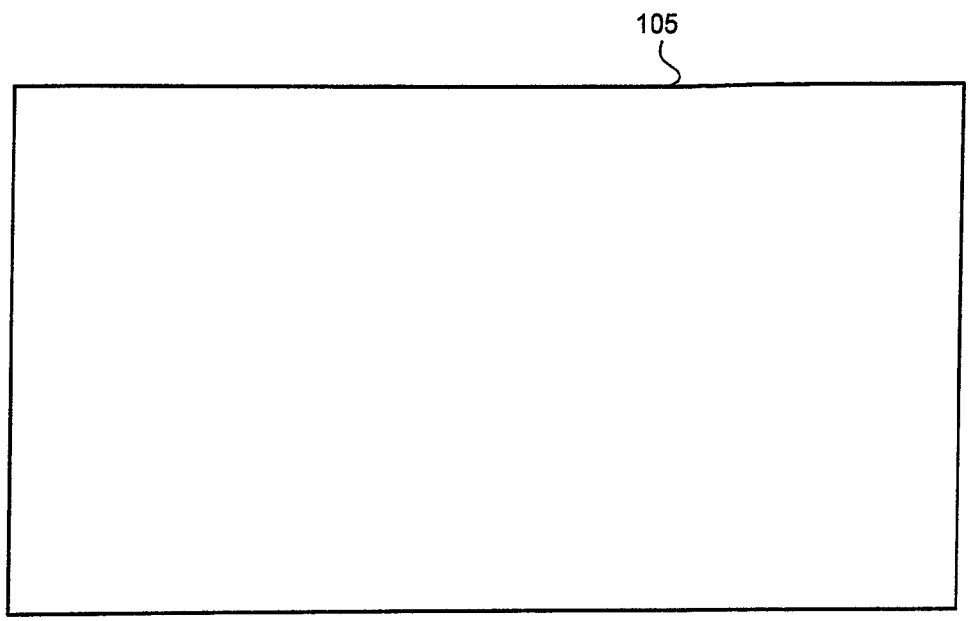
FIG. 8 is a plan view of an unpatterned metal foil in accordance with an embodiment of the present disclosure.

Referring next to FIG. 4, the metal foil 105 is roughly located above the solar cell structure 100. The metal foil 105 is a "metal foil" in that it comprises a pre-fabricated thin sheet of metal. FIG. 8 is a plan view of the metal foil 105 at this stage of the fabrication process. As shown in FIG. 8, the metal foil 105 is unpatterned. As will be more apparent below, the metal foil 105 is subsequently patterned to form metal fingers of the solar cell after the metal foil 105 has been fitted to the metal layer 104.

Figure 5:
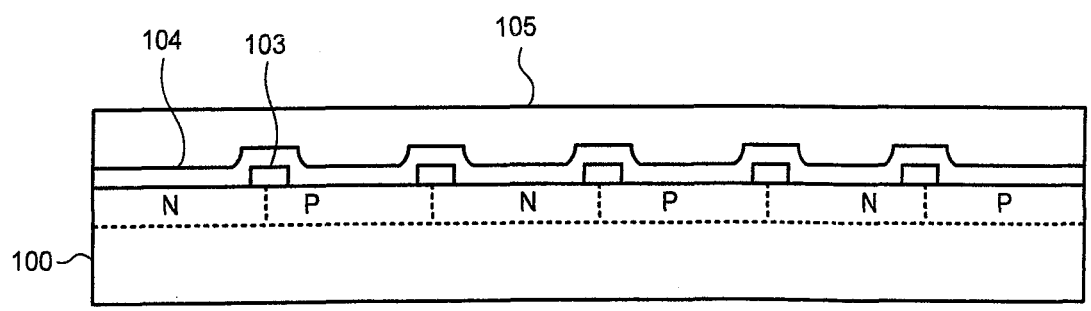

Continuing in FIG. 5, the metal foil 105 is placed on the solar cell structure 100. Unlike metal that is deposited or coated on the solar cell structure 100, the metal foil 105 is a pre-fabricated sheet. In one embodiment, the metal foil 105 comprises a sheet of aluminum. The metal foil 105 is placed on the solar cell structure 100 in that it is not formed on the solar cell structure 100. In one embodiment, the metal foil 105 is placed on the solar cell structure 100 by fitting to the metal layer 104. The fitting process may include pressing the metal foil 105 to the metal layer 104 such that the metal foil 105 makes intimate contact with the metal layer 104. The fitting process may result in the metal foil 105 being conformal over features (e.g., bumps) of the metal layer 104. Vacuum may be used to press the metal foil 105 against the metal layer 104 to obtain a gap of less than 10 microns between them during welding. A pressure plate may also be used to press the metal foil 105 against the metal layer 104 during welding; the pressure plate is removed for laser ablation.

Figure 6:
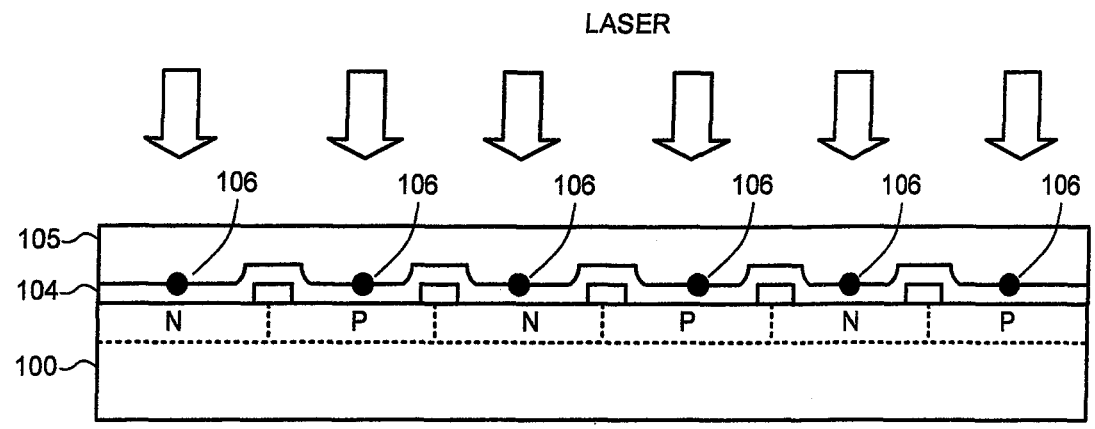

FIG. 6 shows the solar cell structure 100 after the metal foil 105 is electrically bonded to the metal layer 104. In the example of FIG. 6, the metal foil 105 is welded to the metal layer 104 by directing a laser beam on the metal foil 105 while the metal foil 105 is pressed against the metal layer 104. The laser welding process creates weld joints 106 that electrically bond the metal foil 105 to the metal layer 104. Because the metal foil 105 is unpatterned at this stage of the fabrication process, the metal foil 105 still electrically connects the N-type and P-type doped regions of the solar cell structure 100.

Figure 7:
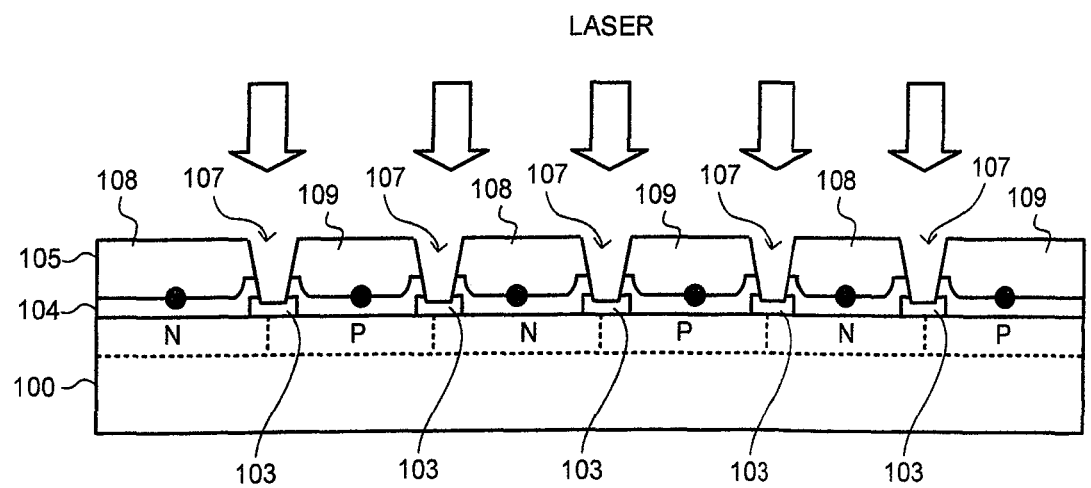

Continuing in FIG. 7, the metal foil 105 is patterned to form metal fingers 108 and 109. In one embodiment, the metal foil 105 is patterned by ablating portions of the metal foil 105 and metal layer 104 that are over the dielectric spacers 103. The metal foil 105 and the metal layer 104 may be ablated using a laser beam. The laser ablation process may cut (see 107) the metal foil 105 into at least two separate pieces, with one piece being a metal finger 108 that is electrically connected to the N-type doped regions and another piece being a metal finger 109 that is electrically connected to the P-type doped regions. The laser ablation process breaks the electrical connection of the N-type and P-type doped regions through the metal layer 104 and the metal foil 105. The metal foil 105 and the metal layer 104 are thus patterned in the same step, advantageously reducing fabrication cost.

Figure 9:
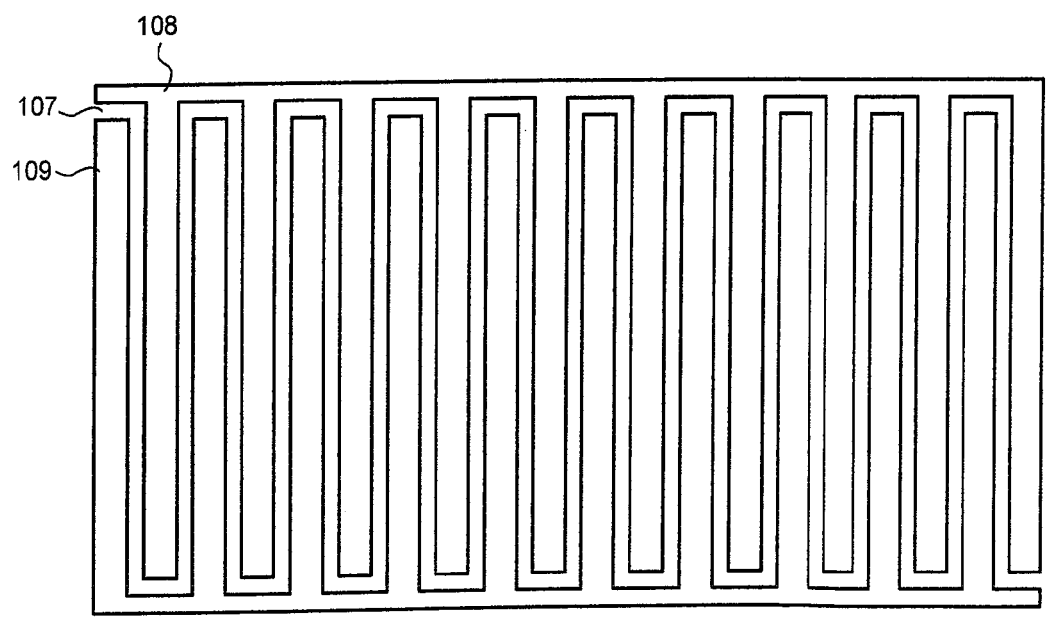
FIG. 9 is a plan view of the metal foil of FIG. 8 after patterning, in accordance with an embodiment of the present disclosure.

FIG. 9 is a plan view of the patterned metal foil 105 of FIG. 7 in accordance with an embodiment of the present disclosure. FIG. 9 shows that the cut 107 physically separates the metal finger 108 from the metal finger 109. In the example of FIG. 9, the metal foil 105 is patterned to form interdigitated metal fingers 108 and 109. Other metal finger designs may also be employed depending on the solar cell.

Returning to FIG. 7, the laser ablation process uses a laser beam that cuts the metal foil 105 and the metal layer 104 all the way through. Depending on the process window of the laser ablation process, the laser beam may also cut portions of, but not through, the dielectric spacer 103. The dielectric spacers 103 advantageously block laser beams that may otherwise reach and damage the solar cell structure 100. The dielectric spacers 103 also advantageously protect the solar cell structure 100 from mechanical damage, such as during fitting of the metal foil 105 to the metal layer 104. The dielectric spacers 103 can be left in the completed solar cell, so their use does not necessarily involve an additional removal step after patterning of the metal foil 105.

In light of the foregoing, one of ordinary skill in the art will appreciate that embodiments of the present disclosure provide additional advantages heretofore unrealized. Use of metal foils to form metal fingers is relatively cost-effective compared to metallization processes that involve deposition or plating of the metal fingers. The dielectric spacers 103 allow for a laser welding process and a laser ablation process to be performed in-situ, i.e., one after another in the same processing station. The dielectric spacers 103 also enable use of a laser beam to pattern the metal foil 105 while the metal foil 105 is on the solar cell structure 100. As can be appreciated, placing and aligning a sheet of metal foil is much easier compared to placing and aligning separate strips of metal fingers with accuracy in the order of microns. Unlike etching and other chemical based patterning processes, patterning the metal foil 105 using a laser minimizes the amount of residue that may form on the solar cell being fabricated.

It is to be further noted that in the example of FIG. 7, the metal layer 104 is patterned simultaneously with the metal foil 105. This advantageously eliminates extraneous steps to pattern the metal layer 104 to separate the P-type and N-type doped regions before laser welding and ablation.

Figure 10:
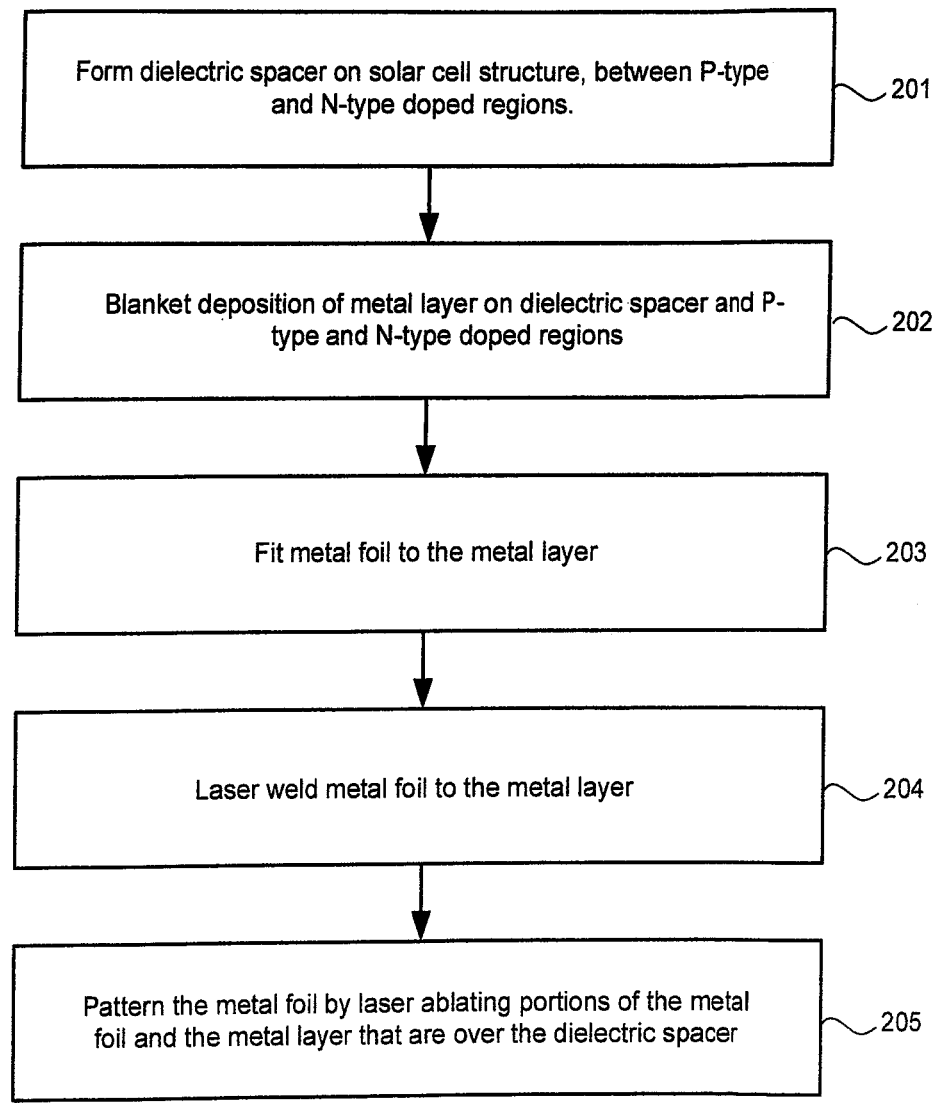
FIG. 10. is a flow diagram of a method of fabricating a solar cell in accordance with an embodiment of the present disclosure.

FIG. 10 shows a flow diagram of a method of fabricating a solar cell in accordance with an embodiment of the present disclosure. The method of FIG. 10 may be performed on a solar cell structure with N-type and P-type doped regions. The method of FIG. 10 may be performed at the cell level during fabrication of the solar cell or at the module level when the solar cell is connected and packaged with other solar cells. Note that in various embodiments, the method of FIG. 10 may include additional or fewer blocks than illustrated.

In the method of FIG. 10, a plurality of dielectric spacers is formed on a surface of the solar cell structure (step 201). Each of the dielectric spacers may be formed over an N-type doped region and a P-type doped region of the solar cell structure. The dielectric spacers may be formed by screen printing, spin coating, or by deposition and patterning, for example. A metal layer is thereafter formed on the dielectric spacers and on the surface of the solar cell structure that is exposed between the dielectric spacers (step 202). In one embodiment, the metal layer is a continuous and conformal layer that is formed by blanket deposition. A metal foil is fitted to the metal layer (step 203). In one embodiment, the metal foil is welded to the metal layer using a laser beam (step 204). It is to be noted that non-laser based welding techniques may also be employed to weld the metal foil to the metal layer. A laser beam may also be used to ablate portions of the metal foil and the metal layer that are over the dielectric spacer (step 205). The laser ablation process patterns the metal foil into separate metal fingers, and patterns the metal layer to separate the P-type and N-type doped regions.

Figure 11:
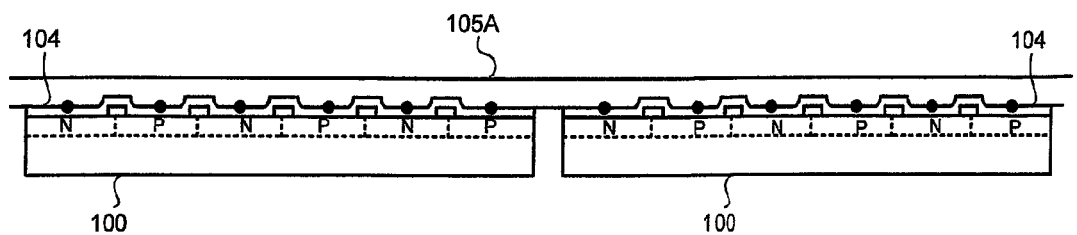
FIGS. 11 and 12 are cross-sectional views that schematically illustrate patterning of a metal foil at the module level, in accordance with an embodiment of the present disclosure.
Figure 12:
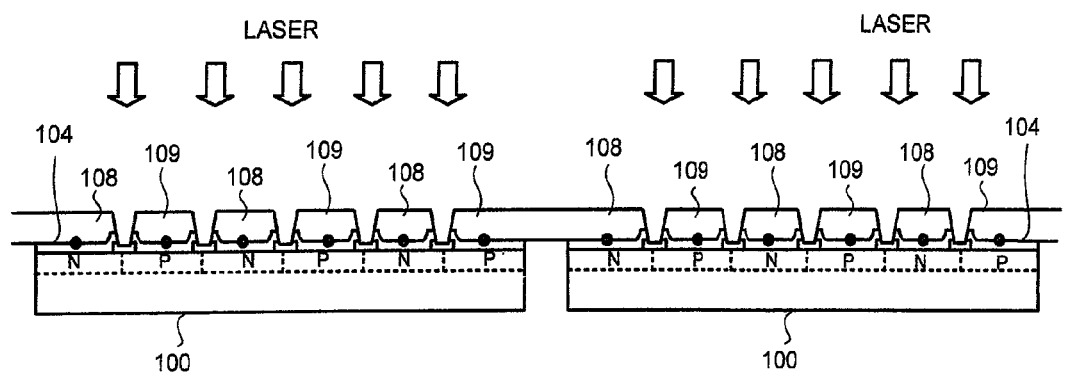

The patterning of the metal foil 105 may be performed at the module level when the solar cell being manufactured is packaged with other solar cells. In that example, the metal foil 105 may be fitted to metal layers 104 of a plurality of solar cell structures 100. This is schematically illustrated in FIG. 11, where a metal foil 105A is fitted to metal layers 104 of two or more solar cell structures 100. The metal foil 105A is the same as the previously discussed metal foil 105 except that the metal foil 105A spans more than one solar cell structure 100. As shown in FIG. 12, the metal foil 105A may be patterned by laser ablation while on the solar cell structures 100. The laser ablation process may pattern the metal foil 105A into metal fingers 108 and 109 as previously discussed. The metal foil 105A may be cut after patterning to physically separate the solar cell structures 100. After patterning, portions of the metal foil 105A may also be left in place to string together adjacent solar cell structures 100.

In one embodiment, the laser ablation of the metal foil 105A leaves a connection between opposite type metal fingers of adjacent solar cell structures 100. This is schematically illustrated in the example of FIG. 12, where the metal foil 105 is patterned such that a P-type metal finger 109 of one solar cell structure 100 is left connected to the N-type metal finger 108 of an adjacent solar cell structure 100, thereby electrically connecting the solar cell structures 100 in series. This advantageously saves fabrication steps at the module level because the patterning of the metal foil 105A may be combined with the stringing of the solar cell structures 100.

Figure 13:
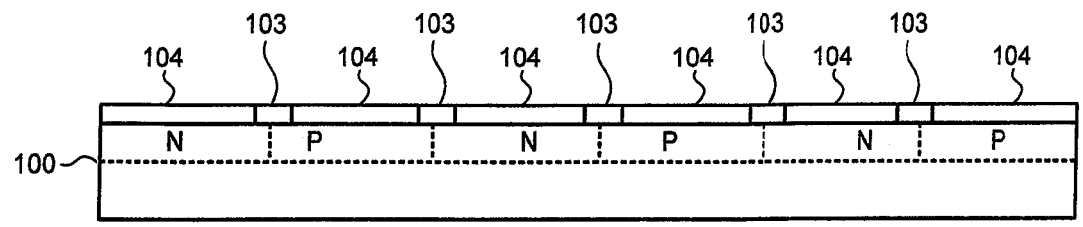
FIGS. 13 and 14 are cross-sectional views that schematically illustrate use of a metal foil with a patterned metal layer, in accordance with an embodiment of the present disclosure.
Figure 14:
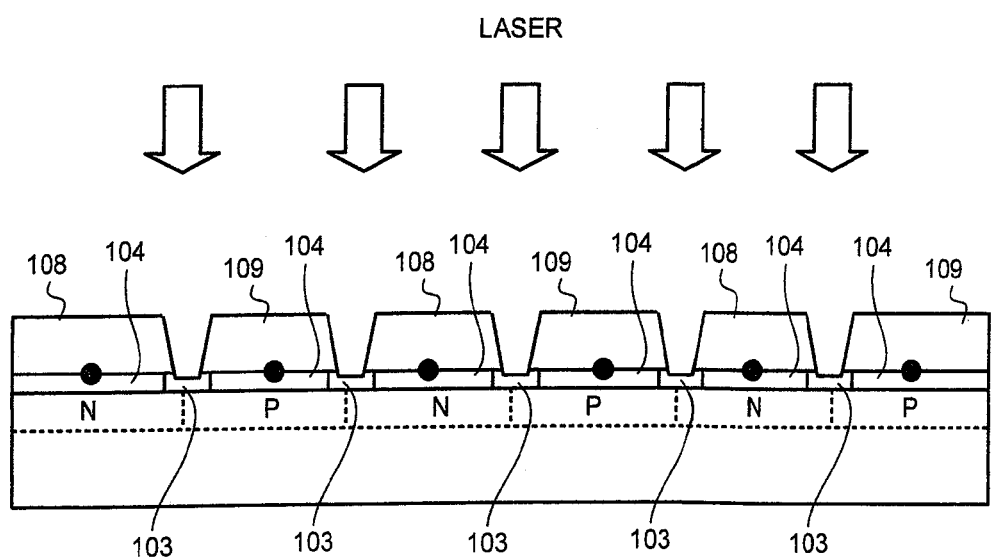

As explained, the metal layer 104 may be formed as a blanket layer of metal that electrically connects the P-type and N-type doped regions and thereafter patterned to separate the P-type and N-type doped regions during patterning of the metal foil 105. In other embodiments, depending on the particulars of the fabrication process, the metal layer 104 may be patterned before laser welding and ablation. This is schematically illustrated in FIG. 13, where the metal layer 104 is formed on the P-type and N-type doped regions without electrically connecting them. For example, the metal layer 104 may be deposited by blanket deposition over the dielectric spacers 103, the N-type doped regions, and the P-type doped regions, and then patterned (e.g., by masking and etching) to separate the N-type doped regions from the P-type doped regions as shown in FIG. 13. The metal foil 105 may then be placed on the patterned metal layer 104 and dielectric spacers 103, laser welded to the metal layer 104, and patterned by laser ablation as previously described. FIG. 14 schematically shows the N-type metal fingers 108 and P-type metal fingers 109 after the laser ablation process in that embodiment. The laser ablation process cuts through the metal foil 105 but stops at the dielectric spacers 103.

Methods and structures for fabricating solar cells have been disclosed. While specific embodiments have been provided, it is to be understood that these embodiments are for illustration purposes and not limiting. Many additional embodiments will be apparent to persons of ordinary skill in the art reading this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
    forming a dielectric spacer on a surface of a solar cell structure;
    depositing a metal layer on portions of the surface of the solar cell structure that are exposed by the dielectric spacer;

fitting a metal foil to the metal layer; and
patterning the metal foil after fitting the metal foil to the metal layer.

2. The method of claim 1, further comprising:
welding the metal foil to the metal layer after fitting the metal foil to the metal layer but before patterning the metal foil.

3. The method of claim 1, wherein fitting the metal foil to the metal layer comprises placing a sheet of aluminum foil on the metal layer.

4. The method of claim 1, wherein patterning the metal foil comprises directing a laser beam on the metal foil to ablate the metal foil and the metal layer.

5. The method of claim 1, wherein depositing the metal layer on the dielectric spacer comprises depositing a blanket layer of metal on the dielectric spacer.

6. The method of claim 1, wherein forming the dielectric spacer on the surface of the solar cell structure includes printing the dielectric spacer on the surface of the solar cell structure.

7. The method of claim 1, further comprising:
after fitting the metal foil to the metal layer but before patterning the metal foil, directing a laser beam on the metal foil to weld the metal foil to the metal layer.

8. A method of fabricating a solar cell, the method comprising:
forming a dielectric spacer over an interface of adjacent P-type and N-type doped regions a solar cell structure;
forming a metal layer over the dielectric spacer;
fitting a metal foil to the metal layer; and
patterning the metal foil in a first laser process after fitting the metal foil to the metal layer.

9. The method of claim 8, further comprising:
welding the metal foil to the metal layer after fitting the metal foil to the metal layer but before patterning the metal foil.

10. The method of claim 8, wherein fitting the metal foil to the metal layer comprises placing a sheet of aluminum foil on the metal layer.

11. The method of claim 8, wherein forming the metal layer on the dielectric spacer comprises depositing a blanket layer of metal on the dielectric spacer.

12. The method of claim 8, wherein the dielectric spacer is printed over the interface of the adjacent P-type and N-type doped regions of the solar cell structure.

13. The method of claim 8, further comprising:
after fitting the metal foil to the metal layer but before patterning the metal foil, welding the metal foil to the metal layer in a second laser process.

14. The method of claim 13, wherein the first and second laser processes are performed in-situ.

15. The method of claim 8, further comprising:
pattering the metal layer and the metal foil in the same first laser process.

16. A method of fabricating a solar cell, the method comprising:
forming a dielectric spacer over a surface of a solar cell structure;
forming a metal layer over the dielectric spacer;
fitting a metal foil to the metal layer;
patterning the metal foil in a laser ablation process after fitting the metal foil to the metal layer; and
welding the metal foil to the metal layer in a laser welding process.

17. The method of claim 16, wherein the laser ablation process and the laser welding process are performed in-situ.

18. The method of claim 16, wherein laser ablation process patterns both the metal layer and the metal foil.

19. The method of claim 16, wherein fitting the metal foil to the metal layer comprises placing a sheet of aluminum foil on the metal layer.

20. The method of claim 16, wherein forming the dielectric spacer over the surface of the solar cell structure includes printing the dielectric spacer over the surface of the solar cell structure.

* * * * *